United States Patent
Van Santen

(10) Patent No.: US 7,358,507 B2
(45) Date of Patent: Apr. 15, 2008

(54) LIQUID REMOVAL IN A METHOD AND DEVICE FOR IRRADIATING SPOTS ON A LAYER

(75) Inventor: Helmar Van Santen, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 357 days.

(21) Appl. No.: 10/538,115

(22) PCT Filed: Nov. 14, 2003

(86) PCT No.: PCT/IB03/05200

§ 371 (c)(1),
(2), (4) Date: Jun. 8, 2005

(87) PCT Pub. No.: WO2004/055803

PCT Pub. Date: Jul. 1, 2004

(65) Prior Publication Data

US 2006/0261288 A1  Nov. 23, 2006

(30) Foreign Application Priority Data

Dec. 13, 2002  (EP)  .................. 02080274

(51) Int. Cl.
*G21G 5/00* (2006.01)

(52) U.S. Cl. .................. 250/492.1; 250/216; 250/234; 250/235; 359/619; 359/581; 369/44.14; 369/112; 430/311; 430/322

(58) Field of Classification Search ............... None
See application file for complete search history.

(56) References Cited

U.S. PATENT DOCUMENTS

| | | | |
|---|---|---|---|
| 6,369,957 B1 | 4/2002 | Ishida | |
| 7,125,652 B2 * | 10/2006 | Lyons et al. | 430/311 |
| 2002/0020821 A1 | 2/2002 | Van Santen et al. | |

FOREIGN PATENT DOCUMENTS

| | | |
|---|---|---|
| JP | 09153233 A | 6/1997 |
| JP | 10255319 A | 9/1998 |
| WO | WO9949504 | 9/1999 |
| WO | WO0213194 A1 | 2/2002 |

* cited by examiner

*Primary Examiner*—Jack I. Berman
*Assistant Examiner*—Zia R. Hashmi
(74) *Attorney, Agent, or Firm*—Michael E. Belk

(57) ABSTRACT

For irradiating a layer (3) a radiation beam (7) is directed and focused to a spot (11) on the layer (3), relative movement of the layer (3) relative to the optical element (59) is caused so that, successively, different portions of the layer (3) are irradiated and an interspace (53) between a surface of the optical element (59) nearest to the layer (3) is maintained. Furthermore, at least a portion of the interspace (53) through which the radiation irradiates the spot (11) on the layer (3) is maintained filled with a liquid (91). By directing a gas flow (71-73) to a surface zone (74) of the layer (3), liquid (91) is reliably prevented from passing that surface zone (74), without causing damage to the layer (3). The liquid (91) is drawn away from the layer (3) in the vicinity of the surface zone (74).

10 Claims, 3 Drawing Sheets

LIQUID REMOVAL IN A METHOD AND DEVICE FOR IRRADIATING SPOTS ON A LAYER

The invention relates to a method of irradiating a layer according to the introductory portion of claim 1 and to a device for irradiating a layer according to the introductory portion of claim 7.

In several embodiments of liquid immersion in dynamic systems, liquid immersion is maintained through continuously supplying liquid. A liquid film is maintained between the lens and the object by constantly supplying liquid through a first supply conduit, e.g. a hole, just upstream of the immersion lens at a sufficiently high pressure to avoid gas inclusion. The moving surface pulls the liquid to the image field, herewith ensuring the imaging field to be immersed. Even though with a careful design of the immersion system liquid flow can be kept low, still continuously liquid is supplied. For stable continuous operation, it is advisable to remove the liquid.

In WO-A-02/13194 a method and a system of the initially identified type are proposed to remove the liquid, related to liquid immersion mastering of optical discs. According to this publication, first a master mold is manufactured, and then, by means of the master mold or by means of a daughter mold manufactured by means of the master mold, an optically scannable information carrier is manufactured by means of a replica process. For manufacturing the master mold, a modulated radiation beam which is directed and focused to a scanning spot on a photosensitive layer carried by a substrate by means of an optical lens system and the substrate and the lens system are moved relatively to each other. An interspace between the photosensitive layer and a nearest surface of a lens system facing the photosensitive layer is maintained filled up with a liquid.

For moving the substrate relative to the lens system a table carrying the substrate is rotated about an axis of rotation. By means of a displacement device, the lens system can be displaced with a radial directional component with respect to the axis of rotation of the table. A liquid supply means supplies the liquid into the interspace between the photosensitive layer and a nearest optical surface of the lens system.

Another method and device for directing a radiation beam to a spot on a photosensitive layer, in which an interspace between the lens and the layer is maintained filled with liquid is disclosed in JP-A-10255319.

It is also known to maintain a gap between a lens and a surface to be irradiated filled with a liquid in optical imaging methods and apparatus, such as optical projection lithography, in which the spot formed by the radiation projected onto the surface is an image or a part of an image. Such a method and apparatus are described in international patent application WO99/49504.

The liquid immersion in dynamic systems, such as wafer steppers in optical lithography and mastering machines in optical disc manufacturing may be maintained by a continuous supply of liquid. Preferably, a liquid film is maintained between the lens and the object by constantly supplying liquid through a hole just upstream of the immersion lens at a sufficiently high pressure to avoid gas inclusion. The moving surface entrains the liquid to the image field, ensuring that interspace between the imaging field (the spot) and the optical element closest thereto is maintained immersed. Even though with a careful design of the immersion system liquid flow can be kept low, still continuously liquid is supplied. For stable continuous operation, it is advisable to remove the liquid. However, a key problem is to break up the adhesive forces between the liquid and the substrate surface without damaging the surface of the substrate. The substrate layer is often very delicate, for instance a soft resist layer.

Imaging systems such as wafer steppers and optical disc mastering equipment usually are very sensitive to mechanical disturbances. Varying forces exerted by the liquid film easily cause undesirable vibrations, which disturb the precision with which the image is projected onto the surface.

It is an object of this invention to reliably remove liquid of a thin liquid film from a substrate without damaging the surface and minimizing mechanical disturbances, in an imaging system for irradiating a surface, such as for example wafer steppers and optical disc mastering equipment.

According to the invention, this object is achieved by providing a method according to claim 1. Also according to the invention, a device according to claim 7 is provided for carrying out a method according to claim 1.

Using a gas flow directed towards the layer, adhesion between the liquid and the layer can be broken up very effectively, without damaging the layer and the liquid can be removed easily from the vicinity of the gas flow where the adhesion is broken up. The gas flow pushes the liquid from the disc. An additional advantage of this system is that most non-sticking particles will be removed too.

Also according to the invention, the gas may be pumped through a second supply conduit at a pressure sufficiently high to cause a net gas flow in the direction opposite to the direction of relative movement of the layer in order to remove the liquid from the layer through a drainage conduit.

Particular embodiments of the invention are set forth in the dependent claims. Other objects, features and effects as well as details of this invention appear from the detailed description of a preferred form of the invention.

Figure 1:
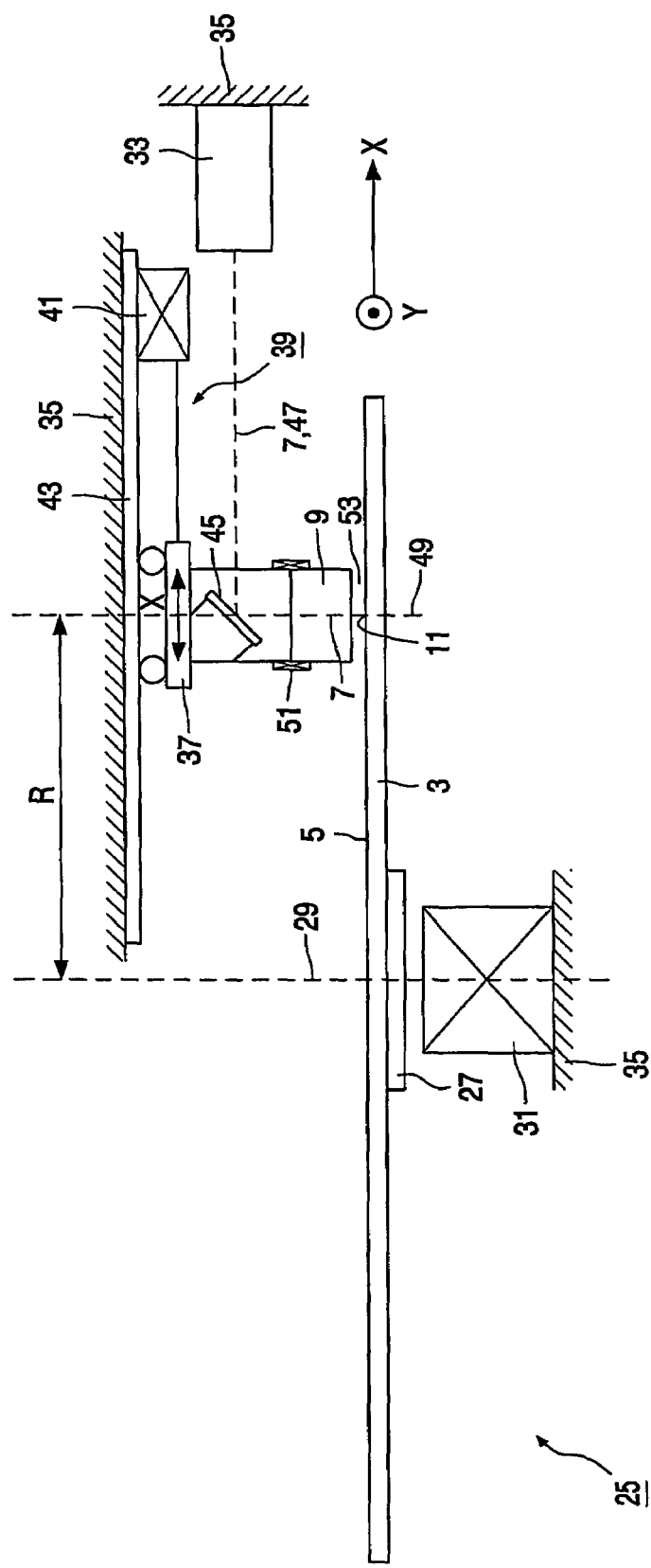
FIG. 1 is a schematic side view of an example of a device for directing radiation to a spot on a layer.

In the manufacture of an optically scannable information carrier, such as a CD or a DVD, a disc-shaped substrate 3 of glass (see FIG. 1) carrying a thin photosensitive layer on one of its two sides is irradiated by means of a modulated radiation beam 7, for instance a DUV laser beam with a wavelength of approximately 260 nm. According to the example shown in FIG. 1, the photosensitive layer 5 is irradiated using a device 25, which is described hereinafter with reference to FIGS. 1-4. The radiation beam 7 is focused to a scanning spot 11 on the photosensitive layer 5 by an optical system in the form of a lens system 9, including a plurality of optical elements. The lens system 9 includes a most distal lens 59, which is the one of the optical elements of the lens system 9 that is located nearest to the layer 5 when in operation. An interspace 53 is maintained between the layer 5 that is irradiated and the one 59 of the optical elements of the lens system 9 that is located nearest to the layer 5. The optical elements may also include other items than lenses, such as filters, shields, diffraction gratings or mirrors.

The layer 5 and the lens system 9 are displaced with respect to each other, so that the modulated radiation beam 7 on the photosensitive layer 5 successively irradiates a series of spots on the layer 5. The irradiated photosensitive layer 5 is subsequently developed by means of a developing liquid, which dissolves the irradiated portions and leaves the non-irradiated portions of the layer on the substrate 3. It is also possible to provide that the irradiated portions are left while the non-irradiated portions are dissolved. In both cases, a series of pits or bumps, which corresponds to the desired series of pit-shaped information elements on the information carrier, are formed in the photosensitive layer 5. The photosensitive layer 5 is subsequently covered with a comparatively thin layer of for instance nickel by means of a sputtering process. Subsequently, this thin layer is covered with a comparatively thick nickel layer in an electro deposition process. In the nickel layer, which is eventually removed from the substrate 3, the pattern of pits formed in the photosensitive layer 5 leaves a corresponding pattern that is a negative of the pattern to be formed in the information carrier to be manufactured, i.e. the master mold comprises a series of raised portions, which correspond to the series of pit-shaped elements formed in the photosensitive layer 5 and to the desired series of pit-shaped information elements on the information carrier. The master mold is thus rendered suitable for use as a mold in an injection-molding machine for injection molding the desired information carriers. Generally, however, a copy of the master mold is used as the mold for injection molding instead of the master mold, which copy of the master mold is commonly referred to as daughter mold, which is manufactured by means of the master mold using a customary replica process which is known per se.

The substrate 3 with the photosensitive layer 5 is carried by a table 27 that is rotatable about an axis of rotation 29, which extends perpendicularly to the table 27 and the substrate 3. The table can be driven by means of a first electromotor 31. The device 25 further comprises a radiation source 33, which, in the example shown, is a laser source, which is secured in a fixed position to a frame 35 of the device 25. It is observed that, as an alternative, the radiation may also be obtained from outside the device. Control over the radiation directed to the layer 5 can be achieved in many ways, for instance by controlling the radiation source 33 and/or by controlling a shutter or radiation diverter (not shown) between the radiation source 33 and the layer 5.

The optical lens system 9 is secured onto a first traveler 37, which can be displaced radially (parallel to the X-direction in the drawings) relative to the axis of rotation 29, by means of a first displacement structure 39. For this purpose, the first displacement structure 39 includes a second electromotor 41 by means of which the first traveler 37 can be displaced over a straight guide 43, which extends parallel to the X-direction and is fixed relative to the frame 35.

A mirror 45 in line with an optical axis 49 of the lens system 9 is also secured to the first traveler 37. In operation, the radiation beam 7 generated by the radiation source 33 follows a radiation beam path 47 extending parallel to the X-direction, and the radiation beam 7 is deflected by the mirror 45 in a direction parallel to the optical axis 49 of the lens system 9. The lens system 9 can be displaced in the direction of its optical axis 49 by means of a focus actuator 51, over comparatively small distances with respect to the first traveler 3, so that the radiation beam 7 can be focused on the photosensitive layer 5. The table 27 with the substrate 5 is rotated about the axis of rotation 29 at a comparatively high speed by means of the first motor 31, and the lens system 9 is displaced parallel to the X-direction by means of the second motor 41 at a comparatively low speed, so that the scanning spots 11 where the radiation beam 7 hits the layer form a spiral-shaped trail over the photosensitive layer 5 of irradiated and non-irradiated elements.

The device 25 can suitably be used to manufacture master molds having a comparatively high information density, i.e. by means of the device 25, a comparatively large number of irradiated elements can be provided per unit area of the photosensitive layer 5. The attainable information density increases as the spot 11 is smaller. The size of the spot 11 is determined by the wavelength of the radiation beam 7 and by the numerical aperture of the lens system 9, the numerical aperture depending upon the optical refractive index of the medium present between the lens system 9 and the photosensitive layer 5. A smaller size of the spot 11 is attainable as the refractive index of the medium present between the lens system 9 and the photosensitive layer 5 is larger. Liquids typically have a much larger optical refractive index than air and therefore the portion of the interspace 53 between the lens system 9 and the photosensitive layer 5 through which the beam 7 extends is maintained filled with a liquid—according to this example water. In the present example, water is also particularly suitable because it is transparent to the DUV radiation beam 7 used and it does not attack the photosensitive layer 5. However, throughout the present detailed description, where water is mentioned it may also be replaced by any other suitable liquid.

Figure 2:
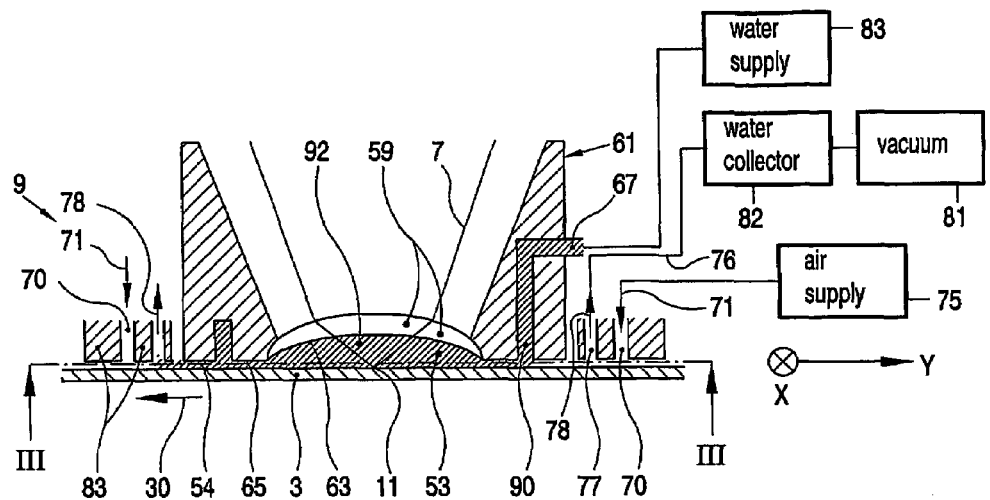
FIG. 2 is a schematic, cross-sectional view of a distal end portion of an example of an optical system for a device as shown in FIG. 1, of a layer to which the radiation is directed and of a liquid flow maintained in operation.
Figure 3:
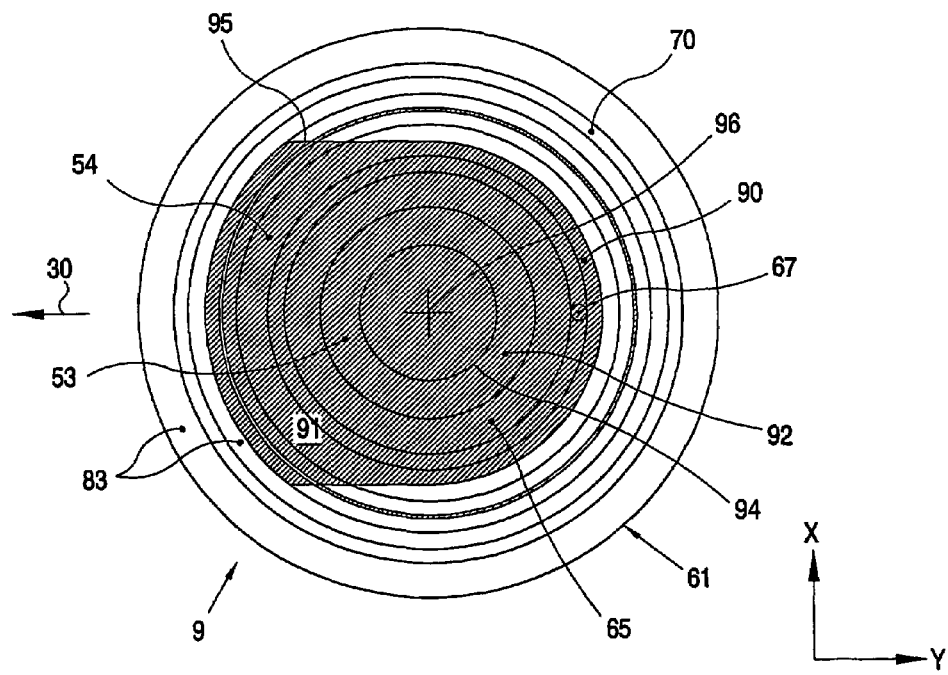
FIG. 3 is a schematic, bottom view along the line III-III in FIG. 2.
Figure 4:
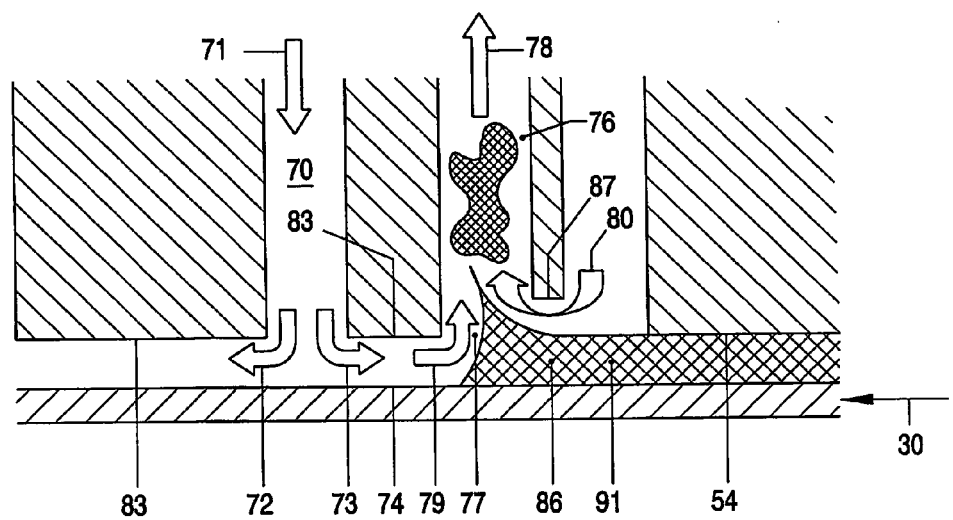
FIG. 4 is an enlarged representation of a portion of FIG. 2 including the zone to which a gas flow is directed.

FIGS. 2 and 3 show, in more detail, the lens system 9, the substrate 3 with the photosensitive layer 5, and the interspace 53 between the photosensitive layer 5 and the lens system 9. The lens 59 nearest to the layer 5 has an optical surface 63 facing the substrate 3 and nearest to the substrate 3. The lenses 55, 59 are suspended in a housing 61, which includes a flat surface 65, which faces the layer 5 and which substantially extends in a plane perpendicular to the optical axis of the lens 59 nearest to the layer 5.

In operation, the portion of the interspace 53 through which the radiation 7 irradiates the spot 11 on the layer 5 is maintained filled with water 91. The water 91 is, at least to some extent, protected against being entrained from the interspace 53 in a recess 92 in the lens system 9 facing the layer 3.

The optimum working distance between the layer 5 and the wall 65, i.e. the portion of the lens assembly nearest to the layer 5, is determined by two factors. On the one hand, the distance should be large enough to retain sufficient tolerance on the distance between the substrate 3 and arrangement of the lenses 55, 59 and the housing 61. On the other hand, this distance should not be too large, because this would require a too large water flow to maintain the immersed condition of the portion of the interspace 53 through which the radiation passes to the spot 11. A presently preferred range for the smallest thickness of the interspace 53 is 3-1500 μm and more preferably 3-500 μm. Larger values for the smallest thickness of the interspace can be particularly advantageous if the liquid has a larger viscosity than water. Also the overall width of the outflow opening affects the upper end of the preferred range for the smallest thickness of the interspace, the smallest thickness of the interspace being preferably smaller than $(100+\frac{1}{20}*W)$ μm in which W is the overall width of the outflow opening measured in a plane parallel to the layer 5. The smallest thickness of the interspace may be larger than approximately 10 μm, for instance larger than 15 μm, 30 μm or even 100 μm, to increase the insensitivity to tolerances.

The outflow opening 90, is at least to a large extent, centered relative to the portion of the interspace 53 through which radiation passes to the spot 11. Accordingly, the direction of movement of the layer 5 and the lens arrangement 9 relative to each other in the area of the spot 11 can be varied substantially without disrupting complete immersion of the portion of the interspace 53 through which the spot 11 is irradiated.

The more the direction of movement of the layer 5 and the lens system 9 parallel to the layer 5 in the area of the spot 11 can be changed without disrupting the immersion of the portion 94 (see FIG. 3) of the interspace 53 through which the radiation actually passes, the more the device is suitable for applications in which the spot 11 needs to move over the surface of the layer in widely varying directions, such as in imaging processes in which the spot is a two-dimensional image projected to the layer 5. In such applications, the advantage of a comparatively large refractive index between the lens system and the medium between the lens system and the irradiated surface is that the image can be projected with a higher resolution, which in turn allows further miniaturization and/or an improved reliability.

Figure 5:
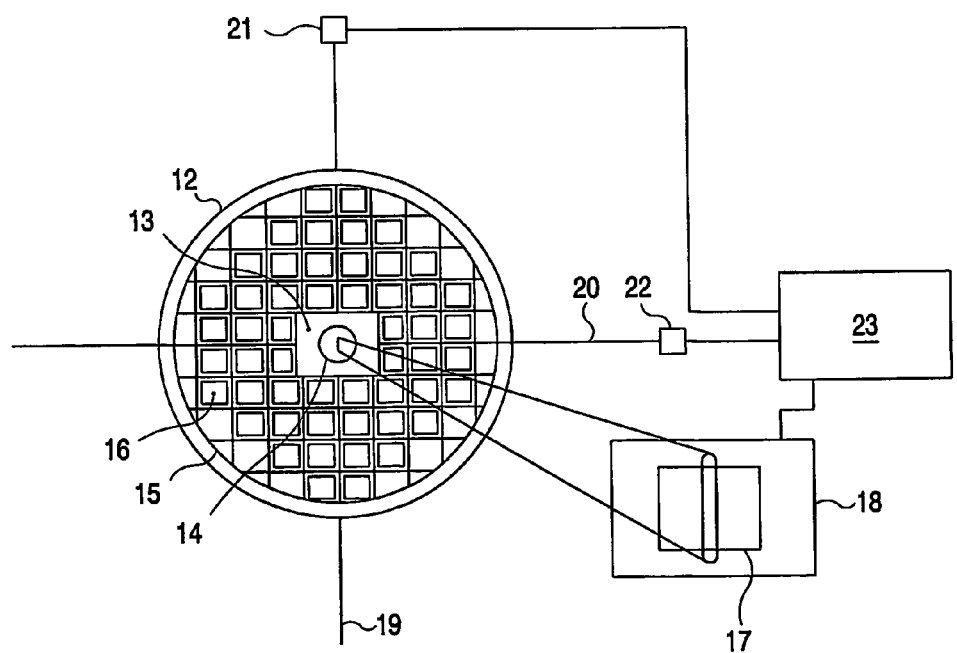
FIG. 5 is a schematic top plan view representation of a wafer stepper/scanner for optical lithography.

An example of such applications is optical projection lithography for the processing of wafers for the manufacture of semiconductor devices. An apparatus and a method for this purpose are schematically illustrated in FIG. 5. Wafer steppers and wafer scanners are commercially available. Accordingly, such methods and apparatus are not described in great detail, but primarily to provide an understanding of water immersion as proposed in the present application in the context of such optical imaging applications.

The projection lithography apparatus according to FIG. 5 includes a wafer support 12 and a projector 13 having a lens assembly 14 above the wafer support 12. In FIG. 5, the wafer support 12 carries a wafer 15 on which a plurality of areas 16 are intended to be irradiated by a beam projecting an image or partial image of a mask or reticle 17 in a scanner 18 operatively connected to the projector 13. The support table is moveable in X and Y direction along spindles 19, 20 driven by spindle drives 21, 22. The spindle drives 21, 22 and the scanner 18 are connected to a control unit 23.

Usually one of the following two principles of operation is applied in optical lithography. In the so-called wafer stepper mode, the projector projects a complete image of the reticle onto one of the areas 16 on the wafer 15. When the required exposure time has been reached, the light beam is switched off or obscured and the wafer 15 is moved by the spindle drives 21, 22 until a next area 16 of the wafer is in the required position in front of the lens assembly 14. Dependent on the relative positions of the exposed area and the next area to be exposed, this may involve relatively quick movement of the lens assembly 14 along the surface of the wafer in widely varying directions. The size of the irradiated spot on the surface of the wafer in which the image of the reticle is projected is typically about 20×20 mm, but larger and smaller spots are conceivable.

In particular when it is desired to manufacture larger semiconductor units, it is advantageous to project the image in the other mode, usually referred to as the wafer scanner mode. In that mode, only a slit-shaped portion of the reticle is projected as a slit shaped spot having a length that is several (for instance four or more) times larger than its width in an area 16 on the surface of the wafer 15. A typical size for the spot is for instance 30×5 mm). Then, the reticle 17 to be scanned is moved along the scanning window while the wafer support 12 is synchronously moved relative to the lens assembly 14 under control of the control unit 23 with a velocity adapted so that only the projection spot, but not the scanned partial image portions of the reticle 17 that are projected on the wafer move relative to the wafer 15. Thus, the image of the reticle 17 is transferred to an area 16 of the wafer as successive portions "unroll" as the spot progresses over the wafer. The movement of the wafer 15 relative to the lens assembly 14 while a running window portion of the reticle is projected onto the wafer 15 is usually carried out relatively slowly and usually each time in the same direction. After the complete image of a reticle 17 has been projected onto the wafer 15, the wafer 15 is generally moved much more quickly relative-to the lens assembly 14 to bring a next area of the wafer 15, where a next image of the reticle 17 is to be projected, in front of the lens assembly 14. This movement is carried out in widely varying directions dependent on the relative positions of the exposed area 16 of the wafer 15 and the next area 16 of the wafer 15 to be exposed. To be able to recommence irradiating the surface of the wafer 15 after the displacement of the wafer 15 relative to the lens 14 (i.e. also the lens or the lens and the wafer may be moved), it is advantageous if the water volume in the interspace between the lens 14 and the surface of the wafer 15 through which the radiation passes is immediately filled with water after completion of that movement, so that the space is reliably immersed before radiation is recommenced.

Also for optical lithography, water can be used, for instance if the radiation is light of a wavelength of 193 mm. However, in some circumstances other liquids may be more suitable.

For supplying water 91 to the interspace 53 between the lens 59 and the layer 5, a water supply conduit 67 extends through the housing 61 and leads to an outflow opening 90. According to the present example, the outflow opening 90 has the form of a slit in a surface 54, which slit 90 is open towards the layer 5, for distributing supplied water 91 longitudinally along the slit 90 and dispensing distributed water towards the layer 5. In operation, the water 91 is distributed via the slit 90 longitudinally along that slit and the water 91 is dispensed from the slit 90 towards the layer 5. This results in a relatively wide water trace 95 and full immersion of the portion 94 of the interspace 53 through which the radiation beam 7 passes, even if the direction of movement of the lens system 9 and the layer 5 relative to each other parallel to the plane of the layer 5 is changed substantially.

The slit 90 can have various forms. In the embodiment shown in FIGS. 2 and 3, the slit is formed such that the outflow opening 90 is located outside the radiation beam 7 and extends around the portion 94 of the interspace 53 through which the radiation 7 irradiates the spot 11. The cross 96 indicates the center, seen in a direction parallel to the optical axis of the lens system 9, of the total cross-sectional passage area of the outflow opening 90.

The water 91 is preferably supplied at a pressure drop between the slit 90 and the environment that is just sufficient to keep portion of the interspace 53 through which the radiation passes reliably immersed. Thus, the amount of water fed to the surface is kept to a minimum.

Furthermore, when the water 91 is dispensed via a slit-shaped outflow opening 90, the smallest thickness of the interspace 153 (in this example the distance between the layer 5 and the surface 54 of the wall portion 65) may be larger, without causing an undue risk of disrupting the immersion of the portion 94 of the interspace through which the radiation passes.

The flow rate at which the water 91 is supplied is preferably such that it can be reliably ensured that a laminar flow with an essentially linear velocity profile is present in the interspace 53. Such a flow exerts a substantially constant force on the wall 65 in which the canal 90 is provided and on the side 63 of the lens 59 nearest to the layer 5. As a result, the water present in the interspace 53 exerts substantially no variable water forces on the lens system 9. Such varying water forces may lead to undesirable vibrations of the lens system 9 and hence to focusing errors and positioning errors of the radiation beam 7 on the photosensitive layer 5. The flow is preferably free of air inclusions, so that the radiation beam 7 is not disturbed.

The water that has been supplied to the layer 3 also has to be removed. The key problem herein is to break up the adhesive forces between the liquid and the surface. In particular when the surface moves fast, such as during the manufacture of masters for manufacturing optical discs, or during movement of a wafer between positions where reticles are to be created, this break-up requires large forces. The surface of the layers, however, usually is very delicate, often a soft resist layer. Moreover, imaging systems such as wafer steppers and optical disc mastering equipment usually are very sensitive to mechanical disturbances. Two phase flow of liquid and gas, which is difficult to avoid in dynamic liquid immersion systems usually is accompanied by mechanical disturbances.

A presently most preferred embodiment of an arrangement and method according to the invention for removing the thin liquid film without damaging the surface while minimizing mechanical disturbances is illustrated in FIGS. 2 and 3.

An air outflow opening 70 is provided for directing an airflow (arrows 71, 72, 73) to a zone 74 of said layer 3 preventing water 91 from passing that zone 74. According to the present example, the air outflow opening communicates with an air supply source 75 as is schematically shown in FIG. 2. The air supply source 75 may for instance include a ventilator or an air pump and may include a reservoir in which air is stored under pressure. Instead of air, the reservoir may also contain a specific gas or mixture of gases. Furthermore, an arrangement for detecting the flow rate of the air, such as a valve or a heated wire and a control valve for controlling the flow rate in accordance with differences between the measured flow rate and the desired flow rate may be provided.

The airflow is preferably supplied at a pressure sufficiently high to cause a net airflow in a direction along the layer 3 opposite to the direction 30 of the movement of the layer 3 relative to the optical system 9. It is thus ensured that water is pushed off the layer 3 and does not reach the portion of the zone 74 where the airflow 71 is bent in different directions 72, 73 and where water might also be urged away from the immersed interspace 53 instead of being restrained to stay in an area closely about the immersed interspace 53.

Furthermore, a discharge channel 76 having an inlet 77 in the vicinity of the air outflow opening 70, and therefore of zone 74, is provided for drawing away (arrows 78, 79, 80) water 91 from the layer 3.

In operation, the airflow 71-73 that is directed to the zone 74 of the layer 3 prevents water 91 from passing that zone 74 by breaking up the adhesion between the water 91 and the layer 3 and forming a barrier in which the pressure is high enough to prevent the water 91 from passing through the zone 74. At the same time, in the vicinity of the zone 74, the water 91 that is prevented from passing the zone 74 is drawn away from the layer 3 via the discharge channel 76. Thus, the initial separation of water 91 from the layer 3 by blowing the water off the layer 3 in the area of the zone 74 is followed by discharge of that water via the discharge channel 76. Since the water 91 is separated from the layer 3 by airflow, the risk of causing damage to the layer 3 is virtually non-existent.

The air outflow opening 70 for directing the airflow 71-73 is a slit. This allows to direct the airflow towards the layer along an elongate zone which is particularly effective for preventing water 91 from displacing away from the optical system 9 beyond the zone 74, in particular if at least a portion of the slit 70 extends transversely to the direction of movement 30 of the layer 3 relative to the optical system 9. The movement of the layer 3 in the direction 30 then entrains the water 91 applied to the layer 3, until it reaches the zone 74 where the airflow 71-73 is directed towards the layer 3. There the airflow 71-73 causes the water 91 to be separated from the layer 3 and the separated water is drawn away from the layer 3.

As is best seen in FIG. 3, the air outflow opening 70 and the inlet 77 of the discharge channel 76 extend about the interspace 53 between the layer 3 and the closest one 59 of the lenses of the optical system 9 that is maintained filled with water. This allows to reliably prevent applied water 91 from escaping from the area under the optical system 9 independently of the direction (parallel to the layer 3) in which the layer 3 is moved, without having to resort to more complicated and/or less rigid alternative solutions, such as directing the airflow selectively from one or more of a plurality of outflow openings or rotating an outflow head about the optical axis of the lens system 9 to keep the outflow opening in a position downstream of the immersed interspace. The circular shape of the air outflow slit 70 and the inlet slit 77 provides for an even distribution of the air outflow and of the suction completing the removal of water from the layer 3.

As is schematically indicated in FIG. 2, the discharge channel 76 connects to vacuum source 81 that maintains a flow 78 through the discharge channel. As is also schematically indicated in FIG. 2, the discharge channel 76 extends through a water collector 83 in which the water removed from the layer 3 is separated from the airflow and may be collected or discharged.

The airflow and can be reduced by reducing the height of the interspace between the layer 3 and a boundary surface 83 facing the layer into which the airflow is introduced. In turn, this is advantageous for reducing disturbances caused by the two-phase flow system. However, a flying height smaller than 2 μm requires very tight tolerances. Therefore, the airflow 71 is entered into an interspace between the layer 3 and a boundary surface 83 having a width (measured perpendicular to the layer 3) of at least 2 μm and preferably at least 5 μm and at most 100 μm and preferably about 30 μm.

The water 91 forms a film on the layer 3 having a thickness, and wherein an interspace 86 between the layer 3 and a surface 87 facing the layer 3 upstream of the discharge channel 76, where the water is discharged, is larger than the thickness of the film. This facilitates the flow of water towards the discharge channel 76 and reduced the pressure at which air needs to be supplied to reliably ensure that no water passes beyond the zone 74.

The displacement of water at a relatively moderate flow rate of the air supply is also enhanced by drawing away water and air from the layer 3 at a higher flow rate than the sum of the flow rates at which air and water are supplied via the channels 67 and 70. Thus, all or virtually all air that is supplied via the channel 70 is drawn towards water and a relatively moderate air supply pressure is sufficient to ensure that all water is lead to the discharge channel 76. The discharge channel 76 has a capacity larger than the water and net upstream gas flow to avoid chaotic splashing at the air-water interface. In the direction perpendicular of the movement of the substrate and in the plane of the substrate, the size of the slit and discharge channel 76 are preferably at least the size of the liquid film.

Putting the gas supply hole close to the vacuum channel can reduce the required gas pressure. Additional advantage of this system is that most non-sticking particles will be removed too.

A constant and low flying height may be achieved by mounting the proposed mechanism to an air bearing. Provided that the layer 3 is sufficiently flat, this allows maintaining a constant and low height without damaging the surface of the layer 3. The proposed mechanism may even be integrated within the air bearing, utilizing the high-pressure channel of the air bearing to push of the water off the surface of the layer 3.

The air supply channel 70 and the water discharge channel 76 extend through a structure that is rigidly connected to the lens system 9, automatically ensuring that the flying height is kept constant. To avoid the transfer of mechanical vibrations in the water removal system to the lens system 9, it may, however, be advantageous to only have a weak connection or axial guidance between the structure containing the air supply channel 70 and the water discharge channel 76, in particular if the supplied air ensures that the distance between the surfaces 83 facing the layer 3 and the layer 3 are maintained within a range suitable for ensuring complete water displacement and avoiding contact with the surface of the layer 3.

The invention claimed is:

1. A method of irradiating a layer (3) including:
   directing and focusing a radiation beam (7) to a spot (11) on said layer (3) by means of at least one optical element (59);
   causing relative movement of the layer (3) relative to said at least one optical element (59) so that, successively, different portions of the layer (3) are irradiated and an interspace (53) between a surface of said at least one optical element (59) nearest to said layer (3) is maintained; and
   maintaining at least a portion of said interspace (53) through which said radiation irradiates said spot (11) on said layer (3) filled with a liquid (91) supplied via a supply conduit;
   characterized by directing gas (71-73) to said layer (3); and
   removing supplied liquid (91) from said layer (3) in the vicinity of a flow of said gas (71-73).

2. A method according to claim 1, wherein said gas (71-73) is supplied at a pressure sufficiently high to cause a net gas flow (71-73) in a direction along said layer (3) opposite to the direction (30) of said movement of said layer (3).

3. A method according to claim 1 or 2, wherein the flow of said gas (71-73) is entered into an interspace between said layer (3) and a boundary surface (83) having a width of at least 2 µm and preferably at least 5 µm and at most 100 µm and preferably 30 µm.

4. A method according to claim 3, wherein the liquid (91) forms a film on said layer (3) having a thickness, and wherein an interspace (86) between said layer (3) and a surface (87) facing said layer (3) upstream of an area where the liquid is discharged is larger than the thickness of said film.

5. A method according to any one of the preceding claims, wherein liquid (91) and gas are drawn away from said layer (3) at a higher flow rate than the sum of the flow rates of said gas flow (71-73) and the supply of said liquid (91).

6. A method according to any one of the preceding claims, wherein said gas (71-73) is air.

7. A device for directing radiation to a layer (3) including:
   at least one optical element (59) for focusing a beam (7) of radiation originating from a radiation source (33) to a spot (11) on said layer (3);
   a displacement structure for causing relative movement of the layer (3) relative to said at least one optical element (59) so that, successively, different portions of the layer (3) are irradiated and an interspace (53) between said layer (3) and a surface of said at least one optical element (59) nearest to said spot (11) is maintained; and
   an outflow opening for supplying liquid (91) to at least a portion of said interspace (53) through which, in operation, said radiation irradiates said spot (11) on said layer (3);
   characterized by a gas outflow opening (70) for directing a gas flow (71-73) to said layer (3); and
   a discharge channel (76) having an inlet (77) in the vicinity of said gas outflow opening (70) for drawing away liquid (91) from the layer (3).

8. A device according to claim 7, wherein said gas outflow opening (70) for directing said gas flow (71-73) is a slit.

9. A device according to claim 7 or 8, wherein said discharge channel (76) communicates with a vacuum source (81).

10. A device according to any one of the claims 7-9, wherein said gas outflow opening (70) and said inlet (77) of said discharge-channel (76) extend about said interspace (53).

* * * * *